(12) United States Patent
Higashijima et al.

(10) Patent No.: US 9,933,702 B2
(45) Date of Patent: Apr. 3, 2018

(54) SUBSTRATE PROCESSING APPARATUS

(71) Applicant: Tokyo Electron Limited, Tokyo (JP)

(72) Inventors: Jiro Higashijima, Koshi (JP);
Nobuhiro Ogata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/251,072

(22) Filed: Aug. 30, 2016

(65) Prior Publication Data
US 2017/0059996 A1 Mar. 2, 2017

(30) Foreign Application Priority Data
Sep. 1, 2015 (JP) .................................. 2015-172096

(51) Int. Cl.
*G03F 7/42* (2006.01)
(52) U.S. Cl.
CPC .................................. *G03F 7/423* (2013.01)
(58) Field of Classification Search
None
See application file for complete search history.

(56) References Cited

U.S. PATENT DOCUMENTS

2008/0251107 A1 10/2008 Osada
2011/0068200 A1* 3/2011 Kim .................. H01L 21/67051
239/589

FOREIGN PATENT DOCUMENTS

JP 2013-207080 A 10/2013

* cited by examiner

*Primary Examiner* — Michael Barr
*Assistant Examiner* — Jason Riggleman
(74) *Attorney, Agent, or Firm* — Pearne & Gordon LLP

(57) ABSTRACT

A processing fluid can be discharged according to a discharge type for a process involved, without a discharge defect. A substrate processing apparatus includes a nozzle and a pipeline. The nozzle is configured to discharge the processing fluid toward a substrate, and the processing fluid is supplied to the nozzle through the pipeline. The pipeline has a three-layer structure having a first layer, a second layer and a third layer in this sequence from an inner side thereof. Further, a leading end portion of the first layer and a leading end portion of the third layer are bonded to the nozzle, and the leading end portion of the first layer is located at a position which is not protruded more than a leading end portion of the second layer with respect to a discharging direction of the processing fluid.

9 Claims, 4 Drawing Sheets

SUBSTRATE PROCESSING APPARATUS

CROSS-REFERENCE TO RELATED APPLICATION

This application claims the benefit of Japanese Patent Application No. 2015-172096 filed on Sep. 1, 2015, the entire disclosures of which are incorporated herein by reference.

TECHNICAL FIELD

The embodiments described herein pertain generally to a substrate processing apparatus.

BACKGROUND

In a manufacturing process of a semiconductor device, an etching process, an ion implantation process or the like is performed by using a resist, which is formed on a substrate, as a mask. Then, the resist which is no more necessary is removed from the substrate.

As a method of removing the resist, there is known a SPM process of removing the resist by supplying SPM (Sulfuric acid Hydrogen Peroxide Mixture), which is a mixed solution of sulfuric acid and hydrogen peroxide, onto the substrate. To enhance the resist removal capability of the SPM, the SPM is discharged onto the substrate from a nozzle in a state that the SPM is heated to a high temperature (see, for example, Patent Document 1).

Patent Document 1: Japanese Patent Laid-open Publication No. 2013-207080

In the aforementioned prior art, however, there is still a room for improvement in that the processing liquid needs to be discharged without a discharge defect.

Specifically, in case of using the high-temperature processing liquid as in the prior art, the nozzle may be thermally deformed by being affected with the heat of the processing liquid, so that the discharge defect such as a change in a discharge position or a discharge state may occur. Further, there may exist various discharge types in the processes using the high-temperature processing liquid, and, thus, there has been a demand for a discharging structure of the processing liquid capable of dealing with such various discharge types.

Furthermore, this demand is a common problem for various cases of using a processing fluid including a gas. Moreover, this demand may be required depending on a discharge type for a process involved, without being limited to the case of using the high-temperature processing liquid.

SUMMARY

In view of the foregoing, exemplary embodiments provide a substrate processing apparatus capable of discharging a processing fluid according to a discharge type for a process involved.

In one exemplary embodiment, a substrate processing apparatus includes a nozzle and a pipeline. The nozzle is configured to discharge a processing fluid toward a substrate and the processing fluid is supplied to the nozzle through the pipeline. The pipeline has a three-layer structure having a first layer, a second layer and a third layer in this sequence from an inner side thereof. Further, a leading end portion of the first layer and a leading end portion of the third layer are bonded to the nozzle, and the leading end portion of the first layer is located at a position which is not protruded more than a leading end portion of the second layer with respect to a discharging direction of the processing fluid.

In accordance with the exemplary embodiment, it is possible to discharge a processing fluid according to a discharge type for a process involved, without a discharge defect.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
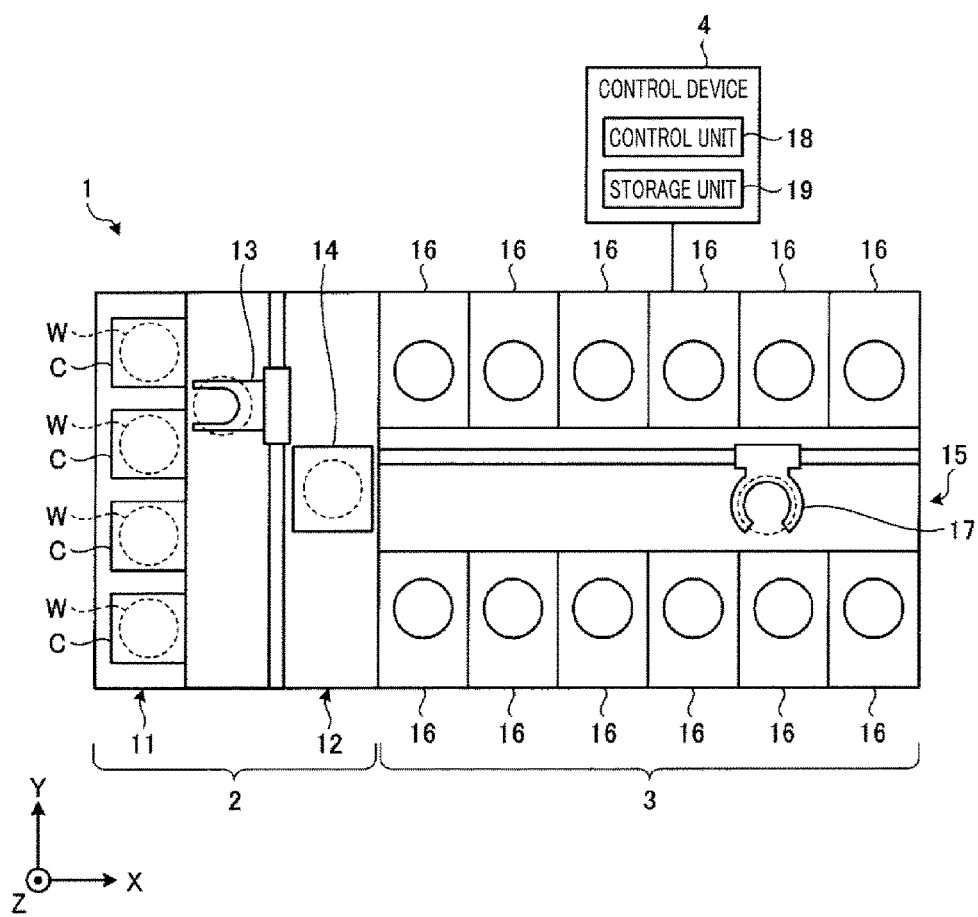
FIG. 1 is a diagram illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Further, the following description will be provided for an example case where a processing liquid is a SPM, which is a mixed solution of sulfuric acid and hydrogen peroxide.

FIG. 1 is a plan view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing portion 11 and a transfer portion 12. In the carrier placing portion 11, a plurality of carriers C is placed to accommodate a plurality of substrates (semiconductor wafers in the present exemplary embodiment) (hereinafter, referred to as "wafers W") horizontally.

The transfer portion 12 is provided adjacent to the carrier placing portion 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer portion 12. The processing station 3 is provided with a transfer portion 15 and a plurality of processing units 16. The plurality of processing units 16 are arranged at both sides of the transfer portion 15.

The transfer portion 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing portion 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing portion 11 by the substrate transfer device 13.

Figure 2:
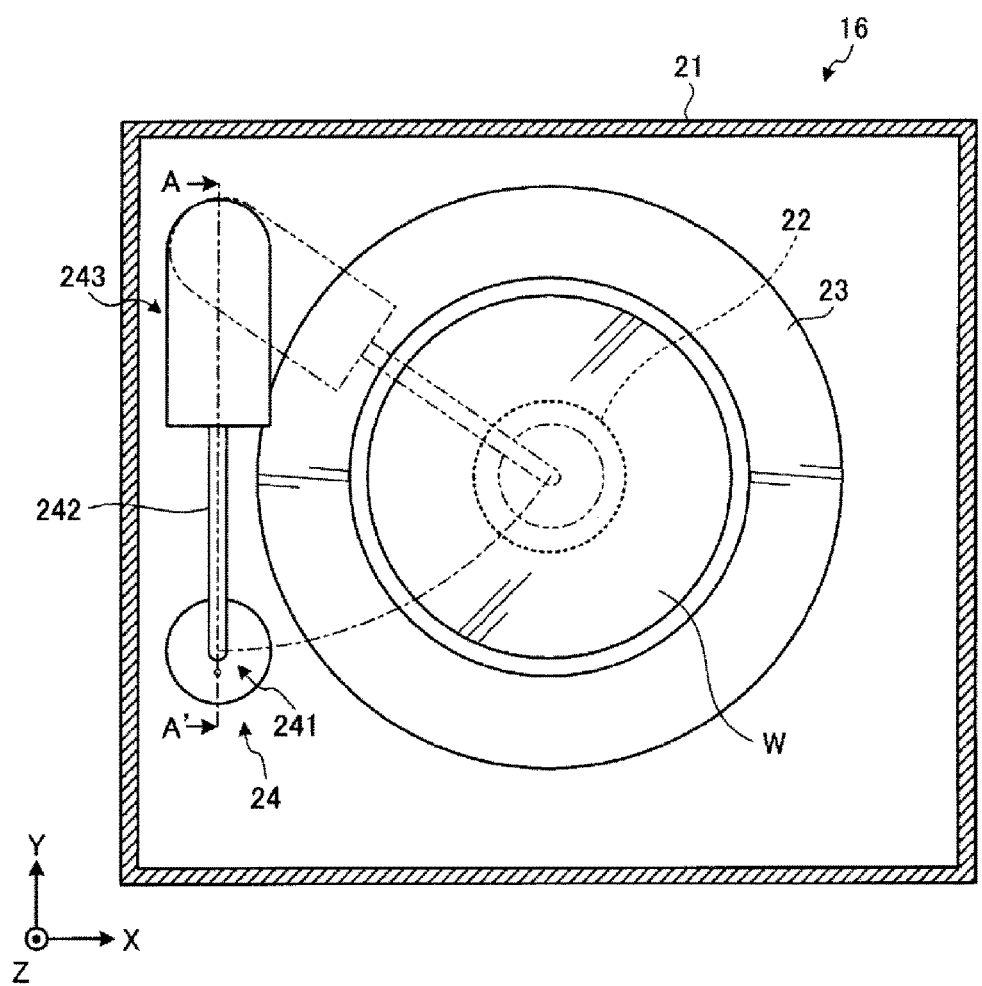
FIG. 2 is a schematic plan view illustrating a configuration of a processing unit.

Now, a schematic configuration of the processing unit 16 will be explained with reference to FIG. 2. FIG. 2 is a schematic plan view illustrating a configuration of the processing unit 16.

As depicted in FIG. 2, the processing unit 16 includes, within a chamber 21, a substrate holding mechanism 22, a recovery cup 23 and a nozzle unit 24.

The substrate holding mechanism 22 is configured to hold the wafer W horizontally and rotate the wafer W held thereon around the vertical axis. The recovery cup 23 is disposed to surround the substrate holding mechanism 22, and is configured to collect a processing liquid which is scattered from the wafer W by a centrifugal force generated through the rotation of the substrate holding mechanism 22.

The nozzle unit 24 is configured to supply the processing liquid toward the wafer W from above the wafer W. This nozzle unit 24 includes a nozzle 241; a nozzle arm 242 configured to support the nozzle 241 at a leading end portion thereof; and an arm supporting unit 243 configured to support the nozzle arm 242 such that the nozzle arm 242 is movable up and down and pivotable.

Figure 3A:
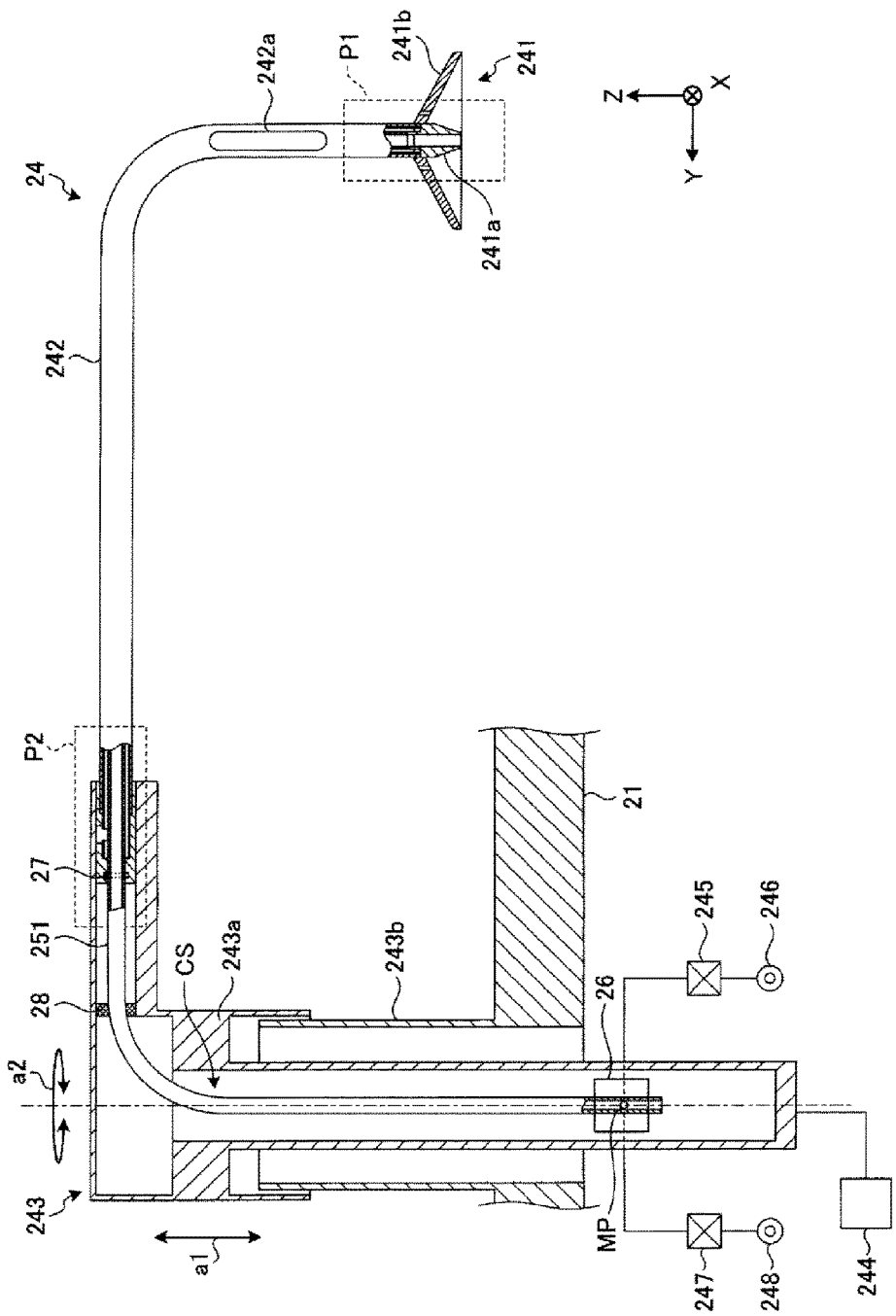
FIG. 3A is a substantially cross sectional view illustrating a nozzle unit.

A configuration of the nozzle unit 24 will be explained in further detail with reference to FIG. 3A. FIG. 3A is a substantially cross sectional view illustrating the configuration of the nozzle unit 24. FIG. 3A is a substantially cross sectional view taken along a line A-A' of FIG. 2.

As depicted in FIG. 3A, the nozzle 241 includes a nozzle tip 241a and a surrounding member 241b. The nozzle tip 241a has a discharge opening 241a1, and is configured to discharge a SPM, which is supplied through the inside of the arm supporting unit 243 and the nozzle arm 242, from the discharge opening 241a1 toward the wafer W.

In case of using the SPM to remove a resist, for example, the SMP is discharged from the nozzle tip 241a at a high temperature of 160° C. or thereabout. In consideration of chemical liquid resistance against the SPM, heat resistance, or the like, a thermoplastic resin such as, but not limited to, PFA may be appropriately used as a material of the nozzle tip 241a.

The surrounding member 241b is formed to have a hollow conical shape with an open top and an open bottom. That is, for example, the surrounding member 241b is formed to have an umbrella shape as shown in FIG. 3A, and is provided to the nozzle tip 241a such that a leading end portion of the nozzle tip 241a is surrounded with the umbrella. The surrounding member 241b is configured to suppress dispersion of the SMP discharged from the nozzle tip 241a.

Here, referring to FIG. 3B which is a schematic enlarged view of a P1 portion shown in FIG. 3A, a detailed configuration of a pipeline 25 through which the SPM is supplied to the nozzle 241 will be explained.

Figure 3B:
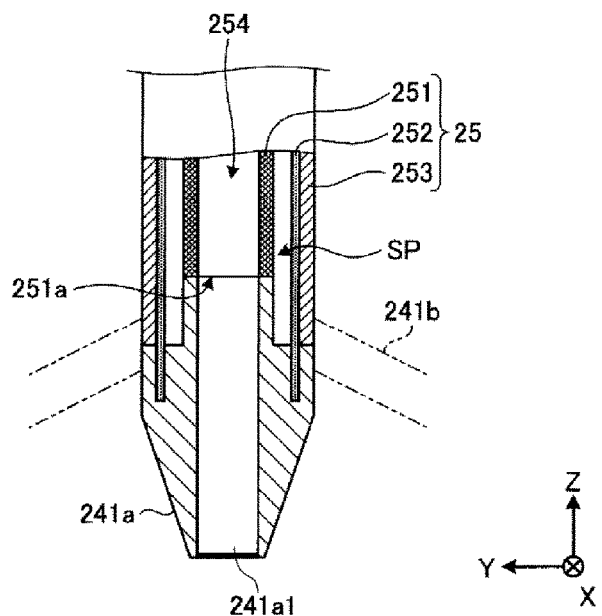
FIG. 3B is a schematic enlarged view of a P1 portion shown in FIG. 3A.

As illustrated in FIG. 3B, the pipeline 25 has a three-layer structure including a first-layer pipeline 251, a second-layer pipeline 252 and a third-layer pipeline 253. The first-layer pipeline 251 is disposed at the innermost side, and a SPM flow path 254 is formed within the first-layer pipeline 251.

As shown in FIG. 3B, the first-layer pipeline 251 is disposed such that a leading end portion 251a thereof is located at a position inner than leading end portions of the second-layer pipeline 252 and the third-layer pipeline 253 with respect to the nozzle 241. This position needs to be not protruded toward a discharging direction of the liquid more than the leading end portion of at least the second-layer pipeline 252. Further, the leading end portion 251a of the first-layer pipeline 251 and the leading end portion of the third-layer pipeline 253 are bonded to the nozzle 241, and the leading end portion of the second-layer pipeline 252 is fixed to the nozzle 241 by being inserted into a circular groove which is previously formed at the nozzle 241.

With this configuration, as compared to a comparative example where the leading end portion 251a of the first-layer pipeline 251 is protruded out to become the nozzle tip 241a itself, the nozzle tip 241a can be modified in various ways depending on a discharge type of the processing liquid for a process involved. Further, the second-layer pipeline 252 made of a metal is inserted to reach the inside of the nozzle 241, so that a high strength thereof can be obtained. Furthermore, the surrounding member 241b is bonded such that a bonding position between the nozzle 241 and the third-layer pipeline 253 is covered, so that the strength thereof can be further enhanced.

Further, in a configuration where the leading end portion 251a of the first-layer pipeline 251 is the nozzle tip 241a itself, as in the comparative example, if the first-layer pipeline 251 is thermally deformed by being affected by heat of the SPM, this thermal deformation may directly lead to a discharge defect from the nozzle tip 241a.

In the present exemplary embodiment, however, since the leading end portion 251a of the first-layer pipeline 251 is not protruded (that is, located at the inner position), the leading end portion 251a and the nozzle tip 241a are configured as separate members. Therefore, such a discharge defect as mentioned above which might be caused by the heat of the SPM may be suppressed.

That is, it is possible to discharge the processing liquid of the high temperature in various ways according to the discharge type for the process involved, without the discharge defect.

A thermoplastic resin such as, but not limited to PFA may be appropriately used as a material of the first-layer pipeline 251, as in the case of the nozzle tip 241a.

The second-layer pipeline 252 is a metal pipe disposed outside the first-layer pipeline 251. As a material of the second-layer pipeline 252, stainless steel or the like may be appropriately used. By covering and fixing the first-layer pipeline 251 with the second-layer pipeline 252 which is the metal pipe, the strength of the pipeline 25 can be enhanced, and, also, the thermal deformation of the first-layer pipeline 251 by the SPM can be suppressed.

Further, it is desirable that a space SP is formed between the first-layer pipeline 251 and the second-layer pipeline 252. Since thermal conduction from the first-layer pipeline 251 to the second-layer pipeline 252 can be blocked by the space SP, this configuration may contribute to maintaining the temperature of the SPM which passes through the SPM flow path 254.

The third-layer pipeline 253 is located outside the second-layer pipeline 252. As in the case of the first-layer pipeline 251, a thermoplastic resin such as, but not limited to, PFA, may be appropriately used as a material of the third-layer pipeline 253.

By covering the second-layer pipeline 252 with the third-layer pipeline 253 and fixing the second-layer pipeline 252 in firm contact with the third-layer pipeline 253, the second-layer pipeline 252 can be protected from corrosion due to the SPM atmosphere or the like.

For example, the leading end portion 251a of the first-layer pipeline 251 is fixed to the nozzle tip 241a by being welded or thermally bonded. Further, the leading end portion of the second-layer pipeline 252 is fixed to the nozzle tip 241a by being inserted into the nozzle tip 241a, for example, as illustrated in FIG. 3B. Further, the leading end portion of the third-layer pipeline 253 is fixed to the nozzle tip 241a by being welded, for example.

Referring back to FIG. 3A, a slit 242a will be explained. As depicted in FIG. 3A, the nozzle arm 242 has the slit 242a. The slit 242a is opened to the second-layer pipeline 252 and serves as a monitoring window for checking a state (e.g., presence or absence of bubbles) of the SPM which flows in the SPM flow path 254 of the first-layer pipeline 251.

A base end portion of the nozzle arm 242 is supported by the arm supporting unit 243. The arm supporting unit 243 includes a moving portion 243a and a fixing portion 243b. The fixing portion 243b is formed as a supporting column shape which has a hollow portion and is extended along a vertical axis (here, Z-axis), and is fixed to the chamber 21.

The moving portion 243a supports the base end portion of the nozzle arm 242 at an upper end portion thereof. Here, referring to FIG. 3C which is a schematic enlarged view of a P2 portion shown in FIG. 3A, a supporting structure for the base end portion of the nozzle arm 242 will be explained.

Figure 3C:
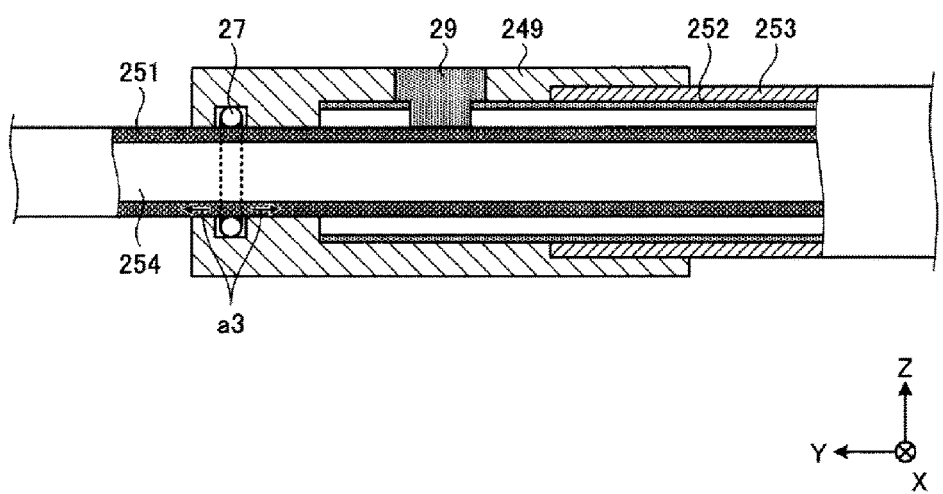
FIG. 3C is a schematic enlarged view of a P2 portion shown in FIG. 3A.

As illustrated in FIG. 3C, the base end portion of the nozzle arm 242 is supported by a supporting member 249 which is provided at the upper end portion of the moving portion 243a. To elaborate, a base end portion of the third-layer pipeline 253 is fixed to the supporting member 249 by, for example, being welded thereat. The supporting member 249 may be made of a thermoplastic resin such as, but not limited to, PTFE.

Further, a base end portion of the second-layer pipeline 252 is fixed by a rotation stop pin 29 such that a rotation thereof in a circumferential direction is suppressed. Thus, even when the moving portion 243a is rotated or moved up and down, the position of the nozzle arm 242 is not deviated.

Furthermore, the first-layer pipeline 251 is disposed to penetrate the supporting member 249 and is held in place at a rear end portion of the supporting member 249 by a first holding seal member 27.

The first holding seal member 27 is implemented by, for example, an O-ring, and is configured to seal around the first-layer pipeline 251 and hold the first-layer pipeline 251 such that the first-layer pipeline 251 is movable along an extending direction (see arrows a3 in the figure) thereof.

By using this first holding seal member 27, it is possible to hold the first-layer pipeline 251 while allowing the first-layer pipeline 251 to be thermally deformed by the SPM.

Referring back to FIG. 3A, the moving portion 243a will now be discussed. The moving portion 243a is formed to have a portion (hereinafter, referred to as "extension portion") which is extended along the hollow portion of the fixing portion 243b. Further, the moving portion 243a is connected to a driving unit 244, and is provided to be movable up and down and pivotable around the vertical axis with respect to the fixing portion 243b by being driven by the driving unit 244 (see arrows a1 and a2).

Further, the moving portion 243a also has the hollow structure. The aforementioned first-layer pipeline 251 connected to the nozzle 241 through the nozzle arm 242 is disposed in the hollow portion of the moving portion 243a, and is connected to a mixing region 26.

The mixing region 26 is a region in which hydrogen peroxide and sulfuric acid are mixed such that the SPM is uniform, and is provided in a line shape within the extension portion of the moving portion 243a along the vertical axis.

A supply system of hydrogen peroxide from a hydrogen peroxide supply source 246 via a valve 245 and a supply system of sulfuric acid from a sulfuric acid supply source 248 via a valve 247 are connected to a mixing position MP of the mixing region 26.

Here, the supply system of the hydrogen peroxide and the supply system of the sulfuric acid are configured to join each other at the mixing position MP. These two liquids joined to each other are made to rise into the mixing region 26 from the mixing position MP.

In the mixing region 26, the hydrogen peroxide and the sulfuric acid joined at the mixing position MP are mixed to become the uniform mixed solution.

Further, it is desirable to arrange the mixing position MP from the leading end portion of the nozzle 241 with a certain processing distance therebetween to suppress bumping that might be caused by mixing the hydrogen peroxide and the sulfuric acid.

Furthermore, the inside of the extension portion of the moving portion 243a in which the mixing region 26 is disposed is configured as a sealed space CS. The sealed space CS is formed by a second holding seal member 28 configured to hold the first-layer pipeline 251 within the moving portion 243a.

The second holding seal member 28 is configured to seal around the first-layer pipeline 251, and is configured to hold the first-layer pipeline 251 such that the first-layer pipeline 251 is movable along the extension direction thereof. Like the first holding seal member 27, the second holding seal member 28 may be implemented by, but not limited to, an O-ring.

As stated above, the substrate processing system 1 (corresponding to an example of a "substrate processing apparatus") according to the present exemplary embodiment includes the nozzle 241, the nozzle arm 242 and the pipeline 25.

The nozzle 241 is configured to discharge the SPM (corresponding to an example of a "processing fluid") toward the wafer W (corresponding to an example of a "substrate"). The nozzle arm 242 is configured to support the nozzle 241 at the leading end portion thereof. The pipeline 25 is provided within the nozzle arm 242 and is configured to supply the SPM to the nozzle 241.

Further, the pipeline 25 has the three-layer structure including the first-layer pipeline 251 (corresponding to an example of a "first layer"), the second-layer pipeline 252 (corresponding to an example of a "second layer") and the third-layer pipeline 253 (corresponding to an example of a "third layer"), which are arranged in this sequence from the inner side of the pipeline 25. In this structure, the leading end portion 251a of the first-layer pipeline 251 is located at the position which is not protruded more than the leading ends of the other layers (that is, located at the inner position) with respect to the nozzle 241.

Thus, according to the substrate processing system 1 of the exemplary embodiment, it is possible to discharge the SPM of the high temperature in various types without the discharge defect.

Further, the above exemplary embodiment has been described for the example case where the SPM is used as the processing fluid. However, the processing fluid is not limited to the SPM, and various other liquids may be used. Furthermore, the processing fluid is not limited to a liquid but may be a gas such as $N_2$.

In addition, the shape of the nozzle tip 241a in the above-described exemplary embodiment is not limited to the shown example. By way of non-limiting example, the nozzle tip 241a may be implemented by a small diameter nozzle for a small flow rate used in a chemical liquid saving process or the like. Further, the nozzle tip 241a may be, for example, an angled nozzle having a preset angle.

Moreover, in the above-described exemplary embodiment, the surrounding member 241b is described to have the hollow conical shape having a circular bottom. However, the surrounding member 241b may have a hollow pyramid shape having a polygonal bottom. Further, a lateral side of the conical (pyramid) shape may not be a plane surface but be a curved surface. Furthermore, the nozzle 241 may not be equipped with the surrounding member 241b. As stated above, it is possible to discharge the fluid without the discharge defect according to the discharge type for the process involved, such as the shape of the nozzle or the kind of the fluid, without being limited to the temperature of the fluid.

More effects or modification examples may be easily conceivable by those skilled in the art. It will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A substrate processing apparatus, comprising:
a nozzle configured to discharge a processing fluid toward a substrate; and
a pipeline through which the processing fluid is supplied to the nozzle,
wherein the pipeline has a three-pipe structure having a first pipe, a second pipe and a third pipe in this sequence from an inner side of the pipeline,
a leading end portion of the first pipe and a leading end portion of the third pipe are bonded to a surface of the nozzle, and a leading end portion of the second pipe is inserted into the nozzle and fixed to the nozzle,
the leading end portion of the first pipe is located at a position which does not protrude more than the leading end portion of the second pipe with respect to a discharging direction of the processing fluid, and
a space is formed between the first pipe and the second pipe.

2. The substrate processing apparatus of claim 1, further comprising:
a nozzle arm configured to support the nozzle at a leading end portion of the nozzle arm; and
an arm supporting unit configured to support a base end portion of the nozzle arm at an upper end portion of the nozzle arm,
wherein the arm supporting unit comprises a supporting member,
the first pipe extends from the base end portion of the nozzle arm, is disposed to penetrate the supporting member, and is movable along an extending direction of the first pipe, and
the second pipe is fixed to the supporting member.

3. The substrate processing apparatus of claim 2,
wherein the arm supporting unit further comprises a first holding seal member configured to seal around the first pipe which extends from the base end portion of the nozzle arm, and configured to hold the first pipe such that the first pipe is movable along the extending direction of the first pipe.

4. The substrate processing apparatus of claim 3, further comprising:
a mixing region in which multiple fluids are uniformly mixed,
wherein the arm supporting unit has a shape of a hollow supporting column extended along a vertical axis, and the mixing region is provided within the supporting column.

5. The substrate processing apparatus of claim 4,
wherein the arm supporting unit further comprises a second holding seal member, the second holding seal member is configured to support the first pipe to form a sealed space within the arm supporting unit, and the mixing region is provided within the sealed space.

6. The substrate processing apparatus of claim 1, wherein the nozzle is equipped with a nozzle tip having a discharge opening for the processing fluid, the leading end portion of the first pipe is welded or thermally bonded to the nozzle tip.

7. The substrate processing apparatus of claim 2, wherein the arm supporting unit further comprises a rotation stop pin, the rotation stop pin is configured to suppress the rotation of the second pipe.

8. The substrate processing apparatus of claim 1, wherein the first pipe and the third pipe are made of thermoplastic resins, and the second pipe is made of a metal.

9. The substrate processing apparatus of claim 1, wherein the processing fluid is a mixed solution of sulfuric acid and hydrogen peroxide.

\* \* \* \* \*